(12) United States Patent
Ho

(10) Patent No.: US 8,178,388 B2
(45) Date of Patent: May 15, 2012

(54) PROGRAMMABLE RESISTIVE RAM AND MANUFACTURING METHOD

(75) Inventor: ChiaHua Ho, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/777,640

(22) Filed: May 11, 2010

(65) Prior Publication Data

US 2010/0221888 A1    Sep. 2, 2010

Related U.S. Application Data

(62) Division of application No. 11/457,702, filed on Jul. 14, 2006, now Pat. No. 7,741,636.

(60) Provisional application No. 60/757,275, filed on Jan. 9, 2006.

(51) Int. Cl.
*H01L 21/00* (2006.01)

(52) U.S. Cl. ................ 438/102; 438/257; 257/E21.179

(58) Field of Classification Search .......... 438/257–267, 438/102; 257/E21.179
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,389,566 A | 2/1995 | Lage | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

WO    0045108 A1    8/2000

(Continued)

OTHER PUBLICATIONS

Ahn, S. J. et al., "Highly Reliable 5nm Contact Cell Technology for 256Mb PRAM," VLSI Technology, Digest of Technical Papers, Jun. 14-16, 2005, pp. 98-99.

(Continued)

*Primary Examiner* — Richard A. Booth

(74) *Attorney, Agent, or Firm* — Kenta Suzue Haynes Beffel & Wolfeld LLP

(57) ABSTRACT

Integrated circuit nonvolatile memory uses programmable resistive elements. In some examples, conductive structures such as electrodes are prepared, and the programmable resistive elements are laid upon the prepared electrodes. This prevents contamination of the programmable resistive elements from previous fabrication steps.

22 Claims, 11 Drawing Sheets

U.S. PATENT DOCUMENTS

| | | |
|---|---|---|
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,808,991 B1 | 10/2004 | Tung |
| 6,815,704 B1 | 11/2004 | Chen |
| 6,830,952 B2 | 12/2004 | Lung |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan et al. |
| 7,291,556 B2 | 11/2007 | Choi et al. |

| | | | | | | |
|---|---|---|---|---|---|---|
| 7,309,630 B2 | 12/2007 | Fan et al. | | 2006/0284157 A1 | 12/2006 | Chen et al. |
| 7,321,130 B2 | 1/2008 | Lung et al. | | 2006/0284158 A1 | 12/2006 | Lung et al. |
| 7,323,708 B2 | 1/2008 | Lee et al. | | 2006/0284214 A1 | 12/2006 | Chen |
| 7,332,370 B2 | 2/2008 | Chang et al. | | 2006/0284279 A1 | 12/2006 | Lung et al. |
| 7,336,526 B2 | 2/2008 | Osada et al. | | 2006/0286709 A1 | 12/2006 | Lung et al. |
| 7,351,648 B2 | 4/2008 | Furukawa et al. | | 2006/0286743 A1 | 12/2006 | Lung et al. |
| 7,359,231 B2 | 4/2008 | Venkataraman et al. | | 2006/0289848 A1 | 12/2006 | Dennison |
| 7,364,935 B2 | 4/2008 | Lung et al. | | 2007/0008786 A1 | 1/2007 | Scheuerlein |
| 7,365,385 B2 | 4/2008 | Abbott | | 2007/0030721 A1 | 2/2007 | Segal et al. |
| 7,379,328 B2 | 5/2008 | Osada et al. | | 2007/0037101 A1 | 2/2007 | Morioka |
| 7,385,235 B2 | 6/2008 | Lung et al. | | 2007/0045605 A1 | 3/2007 | Hsueh |
| 7,394,088 B2 | 7/2008 | Lung | | 2007/0045606 A1 | 3/2007 | Magistretti et al. |
| 7,394,089 B2 | 7/2008 | Doyle et al. | | 2007/0096162 A1 | 5/2007 | Happ et al. |
| 7,397,060 B2 | 7/2008 | Lung | | 2007/0096248 A1 | 5/2007 | Philipp et al. |
| 7,423,300 B2 | 9/2008 | Lung et al. | | 2007/0108077 A1 | 5/2007 | Lung et al. |
| 7,426,134 B2 | 9/2008 | Happ et al. | | 2007/0108429 A1 | 5/2007 | Lung |
| 7,449,710 B2 | 11/2008 | Lung | | 2007/0108430 A1 | 5/2007 | Lung |
| 7,485,891 B2 | 2/2009 | Hamann et al. | | 2007/0108431 A1 | 5/2007 | Chen et al. |
| 7,560,337 B2 | 7/2009 | Ho et al. | | 2007/0109836 A1 | 5/2007 | Lung |
| 7,579,613 B2 | 8/2009 | Lung et al. | | 2007/0109843 A1 | 5/2007 | Lung et al. |
| 7,741,636 B2 | 6/2010 | Ho | | 2007/0111429 A1 | 5/2007 | Lung |
| 2001/0055838 A1 | 12/2001 | Walker et al. | | 2007/0115794 A1 | 5/2007 | Lung |
| 2002/0042158 A1 | 4/2002 | Kersch et al. | | 2007/0117315 A1 | 5/2007 | Lai et al. |
| 2002/0070457 A1 | 6/2002 | Sun et al. | | 2007/0121363 A1 | 5/2007 | Lung |
| 2002/0081833 A1 | 6/2002 | Li et al. | | 2007/0121374 A1 | 5/2007 | Lung et al. |
| 2002/0113273 A1 | 8/2002 | Hwang et al. | | 2007/0126040 A1 | 6/2007 | Lung |
| 2003/0072195 A1 | 4/2003 | Mikolajick | | 2007/0131922 A1 | 6/2007 | Lung |
| 2003/0095426 A1 | 5/2003 | Hush et al. | | 2007/0131980 A1 | 6/2007 | Lung |
| 2003/0186481 A1 | 10/2003 | Lung | | 2007/0138458 A1 | 6/2007 | Lung |
| 2003/0215978 A1 | 11/2003 | Maimon et al. | | 2007/0147105 A1 | 6/2007 | Lung et al. |
| 2004/0026686 A1 | 2/2004 | Lung | | 2007/0153563 A1 | 7/2007 | Nirschl |
| 2004/0051094 A1 | 3/2004 | Ooishi | | 2007/0154847 A1 | 7/2007 | Chen et al. |
| 2004/0113137 A1 | 6/2004 | Lowrey | | 2007/0155172 A1 | 7/2007 | Lai et al. |
| 2004/0165422 A1 | 8/2004 | Hideki et al. | | 2007/0158632 A1 | 7/2007 | Ho |
| 2004/0234895 A1 | 11/2004 | Lee et al. | | 2007/0158633 A1 | 7/2007 | Lai et al. |
| 2004/0248339 A1 | 12/2004 | Lung | | 2007/0158645 A1 | 7/2007 | Lung |
| 2004/0256610 A1 | 12/2004 | Lung | | 2007/0158690 A1 | 7/2007 | Ho et al. |
| 2005/0018526 A1 | 1/2005 | Lee | | 2007/0158862 A1 | 7/2007 | Lung |
| 2005/0029502 A1 | 2/2005 | Hudgens | | 2007/0161186 A1 | 7/2007 | Ho |
| 2005/0062087 A1 | 3/2005 | Chen et al. | | 2007/0173019 A1 | 7/2007 | Ho et al. |
| 2005/0093022 A1 | 5/2005 | Lung | | 2007/0173063 A1 | 7/2007 | Lung |
| 2005/0127347 A1 | 6/2005 | Choi et al. | | 2007/0176261 A1 | 8/2007 | Lung |
| 2005/0127349 A1 | 6/2005 | Horak et al. | | 2007/0187664 A1 | 8/2007 | Happ |
| 2005/0145984 A1 | 7/2005 | Chen et al. | | 2007/0201267 A1 | 8/2007 | Happ et al. |
| 2005/0167656 A1 | 8/2005 | Sun et al. | | 2007/0215852 A1 | 9/2007 | Lung |
| 2005/0191804 A1 | 9/2005 | Lai et al. | | 2007/0224726 A1 | 9/2007 | Chen et al. |
| 2005/0201182 A1 | 9/2005 | Osada et al. | | 2007/0246699 A1 | 10/2007 | Lung |
| 2005/0212024 A1 | 9/2005 | Happ | | 2007/0257300 A1 | 11/2007 | Ho et al. |
| 2005/0212026 A1 | 9/2005 | Chung et al. | | 2007/0262388 A1 | 11/2007 | Ho et al. |
| 2005/0215009 A1 | 9/2005 | Cho | | 2008/0101110 A1 | 5/2008 | Happ et al. |
| 2005/0263829 A1 | 12/2005 | Song et al. | | 2008/0137400 A1 | 6/2008 | Chen et al. |
| 2006/0001174 A1 | 1/2006 | Matsui | | 2008/0164453 A1 | 7/2008 | Breitwisch et al. |
| 2006/0006472 A1 | 1/2006 | Jiang | | 2008/0165569 A1 | 7/2008 | Chen et al. |
| 2006/0038221 A1 | 2/2006 | Lee et al. | | 2008/0165570 A1 | 7/2008 | Happ et al. |
| 2006/0043617 A1 | 3/2006 | Abbott | | 2008/0165572 A1 | 7/2008 | Lung |
| 2006/0066156 A1 | 3/2006 | Dong et al. | | 2008/0166875 A1 | 7/2008 | Lung |
| 2006/0073642 A1 | 4/2006 | Yeh et al. | | 2008/0179582 A1 | 7/2008 | Burr et al. |
| 2006/0077741 A1 | 4/2006 | Wang et al. | | 2008/0180990 A1 | 7/2008 | Lung |
| 2006/0091476 A1 | 5/2006 | Pinnow et al. | | 2008/0186755 A1 | 8/2008 | Lung et al. |
| 2006/0094154 A1 | 5/2006 | Lung | | 2008/0191187 A1 | 8/2008 | Lung et al. |
| 2006/0108667 A1 | 5/2006 | Lung | | 2008/0192534 A1 | 8/2008 | Lung |
| 2006/0110878 A1 | 5/2006 | Lung et al. | | 2008/0197334 A1 | 8/2008 | Lung |
| 2006/0110888 A1 | 5/2006 | Cho et al. | | 2008/0224119 A1 | 9/2008 | Burr et al. |
| 2006/0113521 A1 | 6/2006 | Lung | | 2008/0225489 A1 | 9/2008 | Cai et al. |
| 2006/0118913 A1 | 6/2006 | Yi et al. | | 2009/0148980 A1 | 6/2009 | Yu |
| 2006/0124916 A1 | 6/2006 | Lung | | 2009/0298223 A1 | 12/2009 | Cheek et al. |
| 2006/0126395 A1 | 6/2006 | Chen et al. | | 2010/0193763 A1 | 8/2010 | Chen et al. |
| 2006/0131555 A1 | 6/2006 | Liu et al. | | | | |
| 2006/0138467 A1 | 6/2006 | Lung | | | | |
| 2006/0154185 A1 | 7/2006 | Ho et al. | | | | |
| 2006/0157681 A1 | 7/2006 | Chen et al. | | | | |
| 2006/0163554 A1 | 7/2006 | Lankhorst et al. | | | | |
| 2006/0175599 A1 | 8/2006 | Happ | | | | |
| 2006/0198183 A1 | 9/2006 | Kawahara et al. | | | | |
| 2006/0205108 A1 | 9/2006 | Maimon et al. | | | | |
| 2006/0211165 A1 | 9/2006 | Hwang et al. | | | | |
| 2006/0226409 A1 | 10/2006 | Burr et al. | | | | |
| 2006/0234138 A1 | 10/2006 | Fehlhaber et al. | | | | |
| 2006/0237756 A1 | 10/2006 | Park et al. | | | | |

FOREIGN PATENT DOCUMENTS

| | | | |
|---|---|---|---|
| WO | | 0079539 A1 | 12/2000 |
| WO | | 0145108 A1 | 6/2001 |

OTHER PUBLICATIONS

Gibson, G. A. et al, "Phase-change Recording Medium that Enables Ultrahigh-density Electron-beam Data Storage," Applied Physics Letter, 2005, 3 pp., vol. 86.

Happ, T. D. et al., "Novel None-Mask Self-Heating Pillar Phase Change Memory," 2006 Symposium on VLSI Technology, 2 pp.

Hudgens, S. et al., "Overview of Phase-Change Chalcogenide Non-volatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Pirovano, Agostino et al., "Reliability Study of Phase-Change Non-volatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Wuttig, Matthias, "Towards a Universal Memory?" Nature Materials, Apr. 2005, pp. 265-266, vol. 4.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3.sup.rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. at al., "Full Integration and Reliability Evaluation of Phase-change RAM Based on 0.24.mu.m-CMOS Technologies," 2003 Symposium on VLSI Technology Digest of Technical Papers, pp. 173-174.

Iwasaki, Hiroko at al., "Completely Erasable Phase Change Optical Disk," Jpn, J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43.sup.rd Annual International Reliability Physics Symposium, San Jose, 2005, pp. 157-162.

Kojima, Rie at al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel .mu.Trench Phase-Change Memory Cell for Embedded and Stand Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Pacers/P21.sub.--Tyson.sub.--P.PD-F#search='non-volatile%20high%20density%20high%20performance%20-phase%20chan-ge%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

PROGRAMMABLE RESISTIVE RAM AND MANUFACTURING METHOD

PRIORITY CLAIM

This application is a divisional of U.S. application Ser. No. 11/457,702, filed 14 Jul. 2006 (MXIC 1679-2), which claims the benefit of U.S. Provisional Application No. 60/757,275, filed 9 Jan. 2006 (MXIC 1679-1) by ChiaHua Ho entitled Method of Resistance Random Access Memory Device with Resistor-on-Electrodes Structure, and both of which are hereby incorporated by reference.

BACKGROUND OF THE INVENTION

1. Field of the Invention

The invention relates to integrated circuit nonvolatile memory. In particular, the invention relates to programmable resistive nonvolatile memory, such as phase change memory.

2. Description of Related Art

Nonvolatile memory stores data without requiring a continuous supply of power. Thus, nonvolatile memory is useful in not only integrated circuits with nonvolatile storage as a primary purpose, but also integrated circuits with mission mode circuitry besides just data storage.

However, multi-function circuitry that combines multiple functions in this manner is associated with more complex fabrication. If the multi-function integrated circuit was originally designed only with functions other than storage as its primary functions, the fabrication process must be modified to fabricate the nonvolatile storage. It would be desirable if such modifications could be made while minimizing the changes to the fabrication process of the integrated circuit.

Even with multi-function integrated circuits that are designed from the ground up with the nonvolatile memory in mind, processing compatibility issues are presented by the differing fabrication requirements of the nonvolatile memory and the remaining circuitry. It would be desirable if multi-function integrated circuits with nonvolatile memory were designed to minimize compatibility issues during processing.

SUMMARY OF THE INVENTION

Embodiments of the technology include a method of forming an integrated circuit with nonvolatile memory cells. The step is performed of forming circuitry accessing particular nonvolatile memory cells, prior to the step of forming programmable resistive elements of the nonvolatile memory cells to conductively connect each of the programmable resistive elements with the conductive rows and the conductive columns. Because of the order of the steps in such embodiments, the programmable resistive elements are not damaged by the processes associated with forming the accessing circuitry. In some embodiment, forming programmable resistive elements is a last step of fabrication.

The circuitry accessing particular nonvolatile memory cells includes conductive rows accessing the nonvolatile memory cells by row, and conductive columns accessing the nonvolatile memory cells by column. In embodiments that where the conductive rows are substantially orthogonal to the conductive columns, particular programmable resistive elements are addressed by a combination of a selected columns and selected rows.

In some embodiments, conductive columns include a first layer and a second layer at least partly covering the first layer. The first and second layers of conductive columns have at least one of an etching endpoint signal difference and an etching selectivity difference. In some embodiments, the conductive columns have a stairstep profile of the first and second layers. The stairstep profile results in one embodiment from removing material excess to the second layer, forming sidewalls at least partly covering the second layer, and removing the sidewalls and conductive material excess to the first layer. Such sidewalls are up to 200 nm thick.

In some embodiments, the accessing circuitry also includes all transistors of the conductive rows of the integrated circuit.

In some embodiments, a dielectric layer is formed at least partly between the programmable resistive elements and the conductive columns.

Some embodiments include the step of forming interlayer dielectric, after forming conductive rows and before forming conductive columns. After the interlayer dielectric, then the step is performed of forming at least a first dielectric layer before forming conductive columns. The step of forming conductive columns accessing the nonvolatile memory cells by row includes the step of removing material excess to a first layer of conductive columns, until reaching at least the first dielectric layer. In some embodiments, the first dielectric layer and the second dielectric layer have at least one of an etching endpoint signal difference and an etching selectivity difference.

Some embodiments include the step of forming at least a second dielectric layer, which at least partly covers the conductive columns and is at least partly adjacent to the first dielectric layer. The second dielectric layer has a thickness of about 10 nm to 50 nm. The step is performed of forming at least a third dielectric layer substantially covering the second dielectric layer. In some embodiments, the second dielectric layer and the third dielectric layer have at least one of an etching endpoint signal difference and an etching selectivity difference.

Various embodiments relate to forming the vias and the interlayer contacts in the vias. The step is performed of forming holes through the second dielectric layer and the third dielectric layer until reaching the first dielectric layer, to at least partly expose the conductive columns, and to form interlayer contacts between the conductive rows and the programmable resistive elements. Some embodiments include the step of forming conductive lining in the holes to conductively connect the conductive columns and the programmable resistive elements. Some embodiments also include the step of forming conductive structures in the holes to conductively connect the conductive rows and the programmable resistive elements. Some embodiments also include the step of forming dielectric lining in the holes to allow conductive connection between the conductive rows and the conductive lining only via the programmable resistive elements. The dielectric lining has a thickness between 5 nm and 100 nm.

Following the formation of the structures in the vias, various embodiments include the step of performing chemical mechanical polishing. Some embodiments perform chemical mechanical polishing non-selectively among the second dielectric layer, the third dielectric layer, the conductive lining, the dielectric lining, and the conductive structures. Some embodiments perform chemical mechanical polishing to remove the conductive lining until an elevation of the conductive lining is no higher than an elevation of parts of the third dielectric layer by the conductive lining. Some embodiments perform the step of chemical mechanical polishing on parts of the second dielectric and the third dielectric until said parts no longer cover the conductive columns.

Embodiments of the technology also include an integrated circuit with nonvolatile memory cells formed by a process as described above.

Embodiments of the technology also include an integrated circuit with nonvolatile memory cells. The integrated circuit includes circuitry accessing particular nonvolatile memory cells, including: 1) conductive rows accessing the nonvolatile memory cells by row and 2) conductive columns accessing the nonvolatile memory cells by column. The integrated circuit also includes programmable resistive elements of the nonvolatile memory cells. Each of the programmable resistive elements is conductively connected with the conductive rows and the conductive columns. The programmable resistive elements are positioned vertically above the conductive rows and the conductive columns. In some embodiments, the programmable resistive elements include at least one of: a chalcogenide, $Pr_xCa_yMnO_3$, PrSrMnO, $ZrO_x$, TCNQ, and PCBM.

In some embodiments, the circuitry includes a first dielectric layer covering the conductive rows, such that the conductive columns are above the first dielectric layer; a second dielectric layer at least partly adjacent to the conductive columns and at least partly adjacent to the first dielectric layer; a third dielectric layer at least partly covering the second dielectric layer; and interlayer contacts adjacent to the conductive columns. The interlayer contacts include conductive lining conductively connecting the conductive columns and the programmable resistive elements; dielectric lining allowing conductive connection between the conductive rows and the conductive lining only via the programmable resistive elements; and conductive structures conductively connecting the conductive rows and the programmable resistive elements.

In some embodiments, the first dielectric layer includes at least one of: $SiO_x$ and material having a dielectric constant lower than 3; the second dielectric layer includes at least one of: $SiN_x$, $SiO_xN_y$, and $SiO_x$; the third dielectric layer includes at least one of: $SiO_x$, material having a dielectric constant lower than 3, $SiO_xN_y$, and $SiN_x$; the conductive lining includes at least one of: TiN, Ti, TiN/Ti bilayer, TaN, W, Al, $LiNbO_3$, $IrO_x$, $RuO_x$, YBaCuO, $LaCaMnO_3$, Pt, metal-silicide, doped poly-Si; and the dielectric lining includes at least one of: $SiO_x$, $SiO_xN_y$, $SiN_x$, $SrTiO_3$.

In some embodiments, the circuitry further comprises a fourth dielectric layer at least partly between the programmable resistive elements and the conductive columns. The fourth dielectric layer includes at least one of: $SiO_x$, $SiO_xN_y$, $SiN_x$, $SrTiO_3$, and $AlO_x$.

In some embodiments the conductive columns include first and second layers of conductive columns, such that a stairstep profile characterizes the first and second layers of conductive columns. In some embodiments, the first layer of conductive columns includes at least one of: TiN, Ti, TiN/Ti bilayer, W/TiN bilayer, AlCu/TiN bilayer, doped poly-Si, and metal-silicide; and the second layer of conductive columns includes at least one of: AlCu, TiN/AlCu bilayer, TiN/Ti/AlCu trilayer, W, metal-silicide, and doped poly-Si.

DETAILED DESCRIPTION

Various embodiments are directed at a fast manufacturing method for memory, such as nonvolatile embedded memory implementing resistance device RAM. Examples of resistance device RAM are resistance memory (RRAM), polymer memory, and phase change memory (PCRAM).

Figure 1:
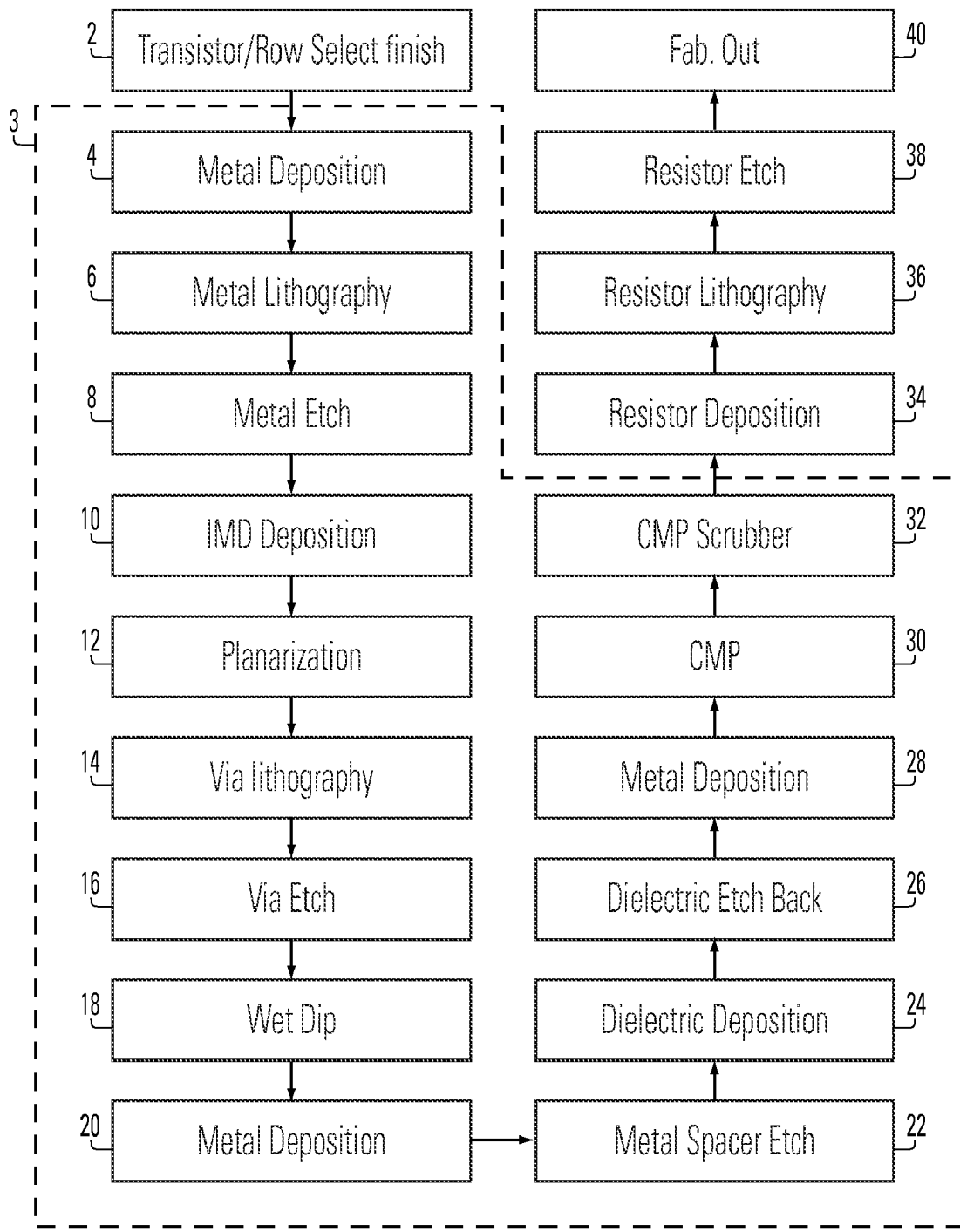
FIG. 1 is an example of a process flow to add programmable resistive memory to an integrated circuit.

FIG. 1 is an example of a process flow to add programmable resistive memory to an integrated circuit. The nonvolatile resistance devices are designed to be the last process of fabrication. The resistive elements of the nonvolatile resistance devices are just formed on already fabricated electrodes. Before that, no contamination issues arise from resistance device in general fabrication of the remainder of the integrated circuit.

In transistor/row select finish 2, the mission circuitry of the integrated circuit other than the programmable resistive nonvolatile storage is fabricated, as well as the row access circuitry of the programmable resistive RAM. After transistor/row select finish 2, the programmable resistive devices are fabricated. There are only 15 general processing steps 3 prior to the fabrication of the actual programmable resistive elements.

In metal deposition 4, metal lithography 6, and metal etch 8, the conductive columns accessing the programmable resistive RAM be column are formed. Etching control performed in metal etch 8 forms a stairstep profile out of the conductive columns, lowering contact resistance between the metal line and the programmable resistive element. Prior to via formation, intermetal dielectric deposition 10 and planarization 12 are performed. Via lithography 14, via etch 16, and wet dip 18 forms the vias for conductive material connecting the row access circuitry to the programmable resistive elements, and for conductive material connecting the column access circuitry to the programmable resistive elements. The via holes are self-aligned in the technique of the via etch 16. The stable widths of the insulator and conductor structures in the vias are based on the two etching processes of metal etch 8 and via etch 16. Metal deposition 20 and metal spacer etch 22 forms the conductive material connecting the row access circuitry to the programmable resistive elements. Dielectric deposition 24 and dielectric etch back 26 forms the dielectric which isolates the conductive material connecting the row access circuitry to the programmable resistive elements, from the conductive material connecting the column access circuitry to the programmable resistive elements. The electrical performance of the resistive devices are tunable by changing the thicknesses of the metal and dielectric spacer structures in the vias, formed during metal deposition 20, metal spacer etch 22, dielectric deposition 24, and dielectric etch back 26. Metal deposition 28 forms the conductive material connecting the row access circuitry to the programmable resistive elements. Prior to forming the actual programmable resistive elements, chemical mechanical polishing 30 and chemical mechanical polishing scrubber 32 are performed. Finally, the programmable resistive elements are formed by resistor deposition 34, resistor lithography 36, and resistor etch 38. Finally the fabrication is complete at fabrication out 40.

Due to the three self-aligned processes of the metal stairstep profile, the via hole opening onto the metal columns, and the small electrode in the vias contacting the row access circuitry, each memory cell follows or almost follows the horizontal design rule of the transistors. In some embodiments, the nonvolatile memory cell area is less than 8.5 $F^2$, with F being the feature size. The three self-align processes also improve yield and form the electrodes prior to the resistive elements.

Because the resistance elements are fabricated last, processes that potentially damage the resistance elements, such as polishing, etching, high temperature treatment, cleaning, etc., are performed prior to forming the resistance elements. This process is also a relatively easy way to add embedded memory to an integrated circuit with other mission functions, because foundry processes compatible with conventional semiconductor processing are performed prior to forming the programmable resistive elements. Additionally, the resistive element processing is relatively simplified, requiring only the positioning of the resistive elements on the already formed electrodes.

Figure 2:
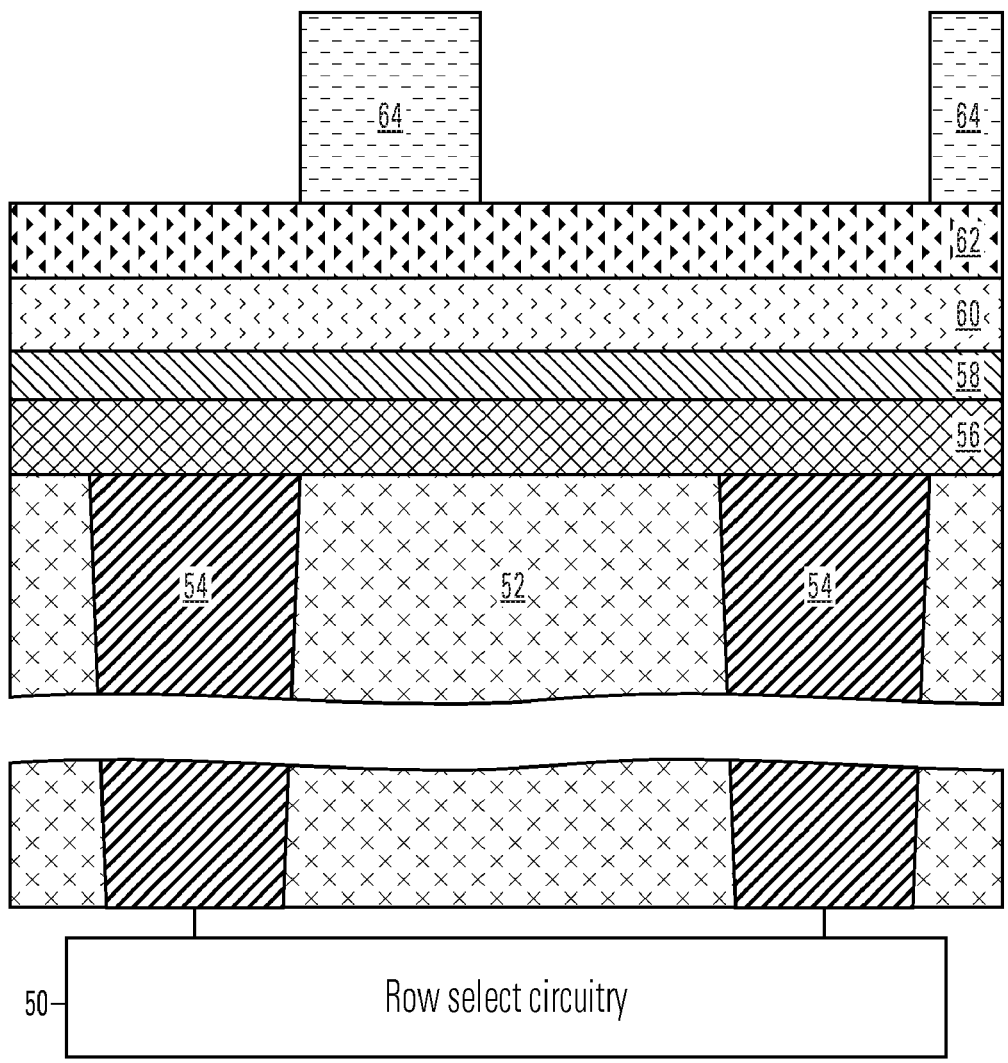
FIG. 2 is a cross-sectional view showing the start of photolithography of conductive columns accessing the programmable resistive memory by column.

FIG. 2 is a cross-sectional view showing the start of photolithography of conductive columns accessing the programmable resistive memory by column.

Dielectric layer 56, Conductive layer 58, Conductive layer 60, and Dielectric layer 62 are deposited on a surface of ILD (interlevel-dielectric) 52, contacts 54, and LIC (local interconnects, not shown, that are used e.g. for the connection of common source). The row select circuitry 50 under the ILD 52 and contacts 54 includes circuitry accessing the programmable resistive memory by row such as row select transistors, and circuitry of the integrated circuit other than the programmable resistive nonvolatile storage.

Example materials of dielectric layer 56 are $SiO_x$ and low-k material. Example materials of conductive layer 58 are TiN, Ti, TiN/Ti bilayer, W/TiN bilayer, AlCu/TiN bilayer, doped poly-Si, metal-silicide, etc. The material of conductive layer 58 has an etching selectivity with respect to conductive layer 60 or an etching endpoint signal difference with conductive layer 60 when etching conductive layer 60.

Example materials of conductive layer 60 are AlCu, TiN/AlCu bilayer, TiN/Ti/AlCu trilayer, W, metal-silicide, doped poly-Si, etc. The material of conductive layer 60 has good adhesion to conductive layer 58 and etching stops on conductive layer 58 when conductive layer 60 is etched.

Examples of materials for (conductive layer 60)/(conductive layer 58) are: (TiN/Ti/AlCu)/(TiN), (W)/(TiN), (TiN)/(W/TiN), ($WSi_x$)/(n+doped poly-Si), etc.

Example materials for dielectric layer 62 are $SiN_x$, $SiO_xN_y$, $SiO_x$, $SrTiO_3$, etc. The material of dielectric layer 62 has good adhesion to the resistive element.

More specific example materials of dielectric layer 62 depend on the material of the resistive element, as follows:

For phase-change memory resistive element of GST, $N_2$ doped GST, etc.: example materials of dielectric layer 62 are $SiO_x$, $SiO_xN_y$, and $SiN_x$, due to thermal conductivity concerns.

For resistance memory resistive element of $Pr_xCa_yMnO_3$, etc.: example materials of dielectric layer 62 are $SiO_x$, $SiO_xN_y$, $SiN_x$, and $SrTiO_3$, due to adhesion concerns and grown crystal issue.

For polymer memory resistive element of TCNQ, PCBM, Cu-TCNQ, $C_{60}$-TCNQ, etc.: example materials of dielectric layer 62 are $SiO_x$, $SiO_xN_y$, $SiN_x$, and $AlO_x$, due to dielectric constant concern.

FIG. 2 shows the start of photolithography of conductive columns, beginning with the conductive line photoresist 64. In an embodiment, the line pitch is the same as that of the transistor contact. The conductive line direction, as seen from a top view, is perpendicular to the row access circuitry, such as gates of transistors or LIC of transistors in the row select circuitry 50.

Figure 3:
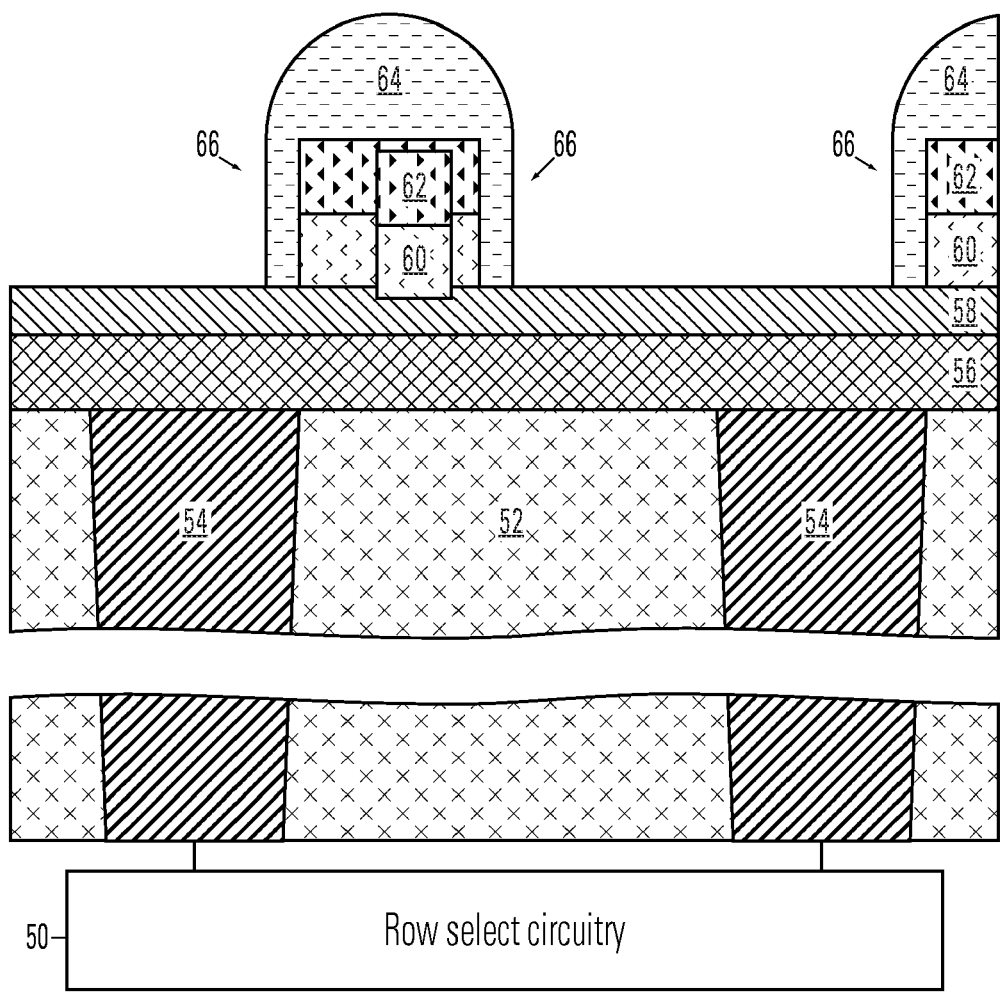
FIG. 3 is a cross-sectional view showing the sidewall structures on the photoresist covering the conductive columns, to form a stairstep profile between the multiple conductive layers associated with a memory column accessing structure.

FIG. 3 is a cross-sectional view showing the sidewall structures on the photoresist covering the conductive columns, to form a stairstep profile between the multiple conductive layers associated with a memory column accessing structure.

Dielectric layer 62 and conductive layer 60 are etched using photoresist 64 and suitable etch chemistries.

Specific examples of etching dielectric layer 62 depend on the material of the dielectric layer 62, as follows:

For materials of dielectric layer 62 of $SiO_x$ or $SiO_xN_y$: etching examples are reactive-ion-etching with $CF_4$, $CHF_3$, Ar, and $N_2$, etc. to open dielectric layer 62.

For materials of dielectric layer 62 of $SiN_x$: etching examples are reactive-ion-etching with $CF_4$, $CHF_3$, $CH_2F_2$, $CH_3F$, $O_2$, and Ar, etc. to open dielectric layer 62.

For materials of dielectric layer 62 of $AlO_x$: etching examples are reactive-ion-etching with $CF_4$, $BCl_3$, $NF_3$, CO, $O_2$, and Ar, etc. to open dielectric layer 62.

Conductive layer 60 is etched using suitable chemistries, stopping on conductive layer 58 by etching selectivity or by catching an etching endpoint signal.

Specific examples of etching conductive layer 60 depend on the material of the conductive layer 60, as follows:

For conductive layer 60/conductive layer 58 of AlCu/TiN: etching examples are reactive-ion-etching with $Cl_2$, $BCl_3$, Ar, and $N_2$ etc. to open conductive layer 60, using an etching endpoint signal to stop on conductive layer 58.

For conductive layer 60/conductive layer 58 of W/TiN: etching examples include reactive-ion-etching with SF6, O2, N2, and Ar, etc. to open conductive layer 60, using the high etching selectivity of W to TiN.

For conductive layer 60/conductive layer 58 of $WSi_x$/n+ doped poly-Si: etching examples include reactive-ion-etching with $Cl_2$, $N_2$, $He/O_2$, $CF_4$, $O_2$, and/or Ar, etc., to open conductive layer 60, using an endpoint signal to stop on conductive layer 58.

Polymer sidewalls are generated, with chemistry examples as follows: $C_4F_8$, $C_4F_6$, $C_5F_8$, $CF_4$, $CH_3F$, $CHF_3$, $CH_2F_2$, Ar, $N_2$, and/or $O_2$ with suitable power, pressure, and other parameters. The thickness of the polymer sidewall ranges from 10 nm~200 nm. The polymer sidewalls are etched using reactive-ion-etching that is the same as dielectric layer 62 and conductive layer 60 with suitable chemistries.

Figure 4:
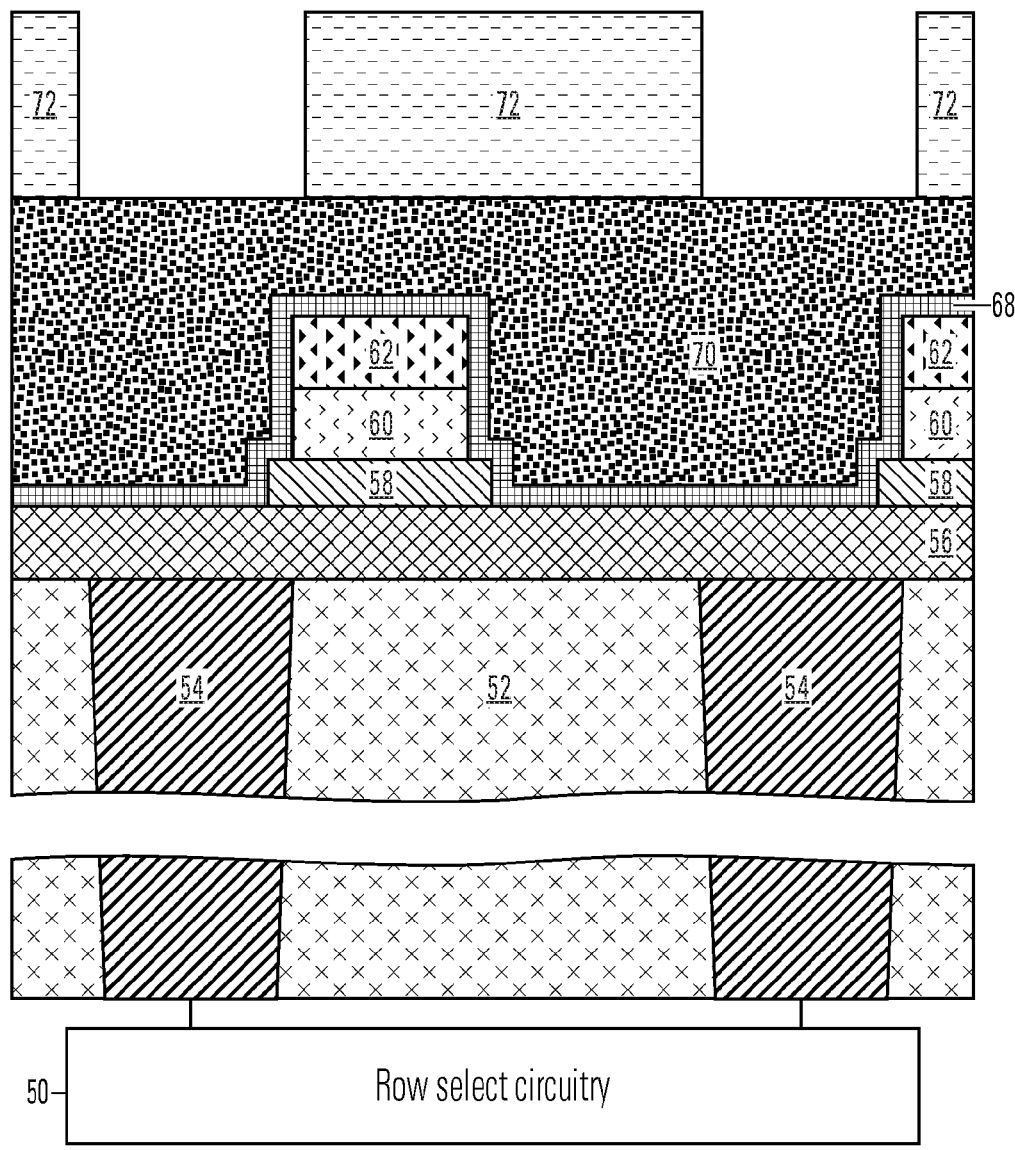
FIG. 4 is a cross-sectional view showing the start of photolithography of vias to electrically connect the programmable resistive memory with the conductive rows accessing the programmable resistive memory by row, and to electrically connect the programmable resistive memory with the conductive columns accessing the programmable resistive memory by column.

FIG. 4 is a cross-sectional view showing the start of photolithography of vias to electrically connect the programmable resistive memory with the conductive rows accessing the programmable resistive memory by row, and to electrically connect the programmable resistive memory with the conductive columns accessing the programmable resistive memory by column.

Conductive layer 58 is etched, stopping on dielectric layer 56 using as a mask the sidewall polymer and the photoresist remaining for metal line lithography.

Specific examples of etching conductive layer 58 depend on the material of the conductive layer 58, as follows:

For conductive layer 58/dielectric layer 56 of TiN/SiO$_2$: etching examples include reactive-ion-etching with Cl$_2$, BCl$_3$, Ar, and/or N$_2$ etc. to open conductive layer 58, using the high etching selectivity of TiN to SiO$_2$.

For conductive layer 58/dielectric layer 56 of n+doped poly-Si/SiO$_2$: etching examples include reactive-ion-etching with HBr, Cl$_2$, N$_2$, He/O$_2$, O$_2$, and/or Ar, etc. to open conductive layer 58, using the high etching selectivity of TiN to SiO$_2$.

The polymer residue is stripped using O$_2$, N$_2$, and/or N$_2$/H$_2$ plasma.

Due to the sidewall polymer effect, the metal line becomes a self-aligned stairstep shape. The step width depends on the thickness of the polymer sidewall.

The dielectric layer 68 is deposited on dielectric layer 56, conductive layer 58, conductive layer 60, and dielectric layer 62. The material of dielectric layer 68 is SiN$_x$, SiO$_x$N$_y$, $_{SiOx}$, etc. Dielectric layer 68 acts as the dry etching stop layer of dielectric layer 70. Dielectric layer 68 is selectively wet etched to open the stairstep of conductive layer 58 after the further via etch, so the dielectric layer 68 has wet etching selectivity to dielectric layer 56.

In one embodiment, the materials of dielectric layer 68/dielectric layer 56 are SiN$_x$/SiO$_x$. The thickness of dielectric layer 68 can be 10 nm~50 nm.

Dielectric layer 70 is deposited on dielectric layer 68. Dielectric layer 70 can be SiOx, low-k material, SiO$_x$N$_y$, and/or SiN$_x$, etc. The dielectric layer 70 is mainly intermetal dielectric (IMD) material. Dielectric layer 70 can be made by high-density plasma (HDP) CVD, spin-on-glass (SOG), plasma-enhanced CVD (PECVD), and/or spin-coating method with or without chemical-mechanical-polishing (CMP). The material of dielectric layer 70 is different from that of dielectric layer 68. Example materials of dielectric layer 70/dielectric layer 68 are SiO$_x$/SiN$_x$.

After planarization of the dielectric layer 70, via hole photolithography is performed. The pitch can be same as that of contact of transistor and metal line. Part of the exposed via hole overlaps the conductive line 58/60. The via-hole photolithography process begins with the photoresist 72.

Figure 5:
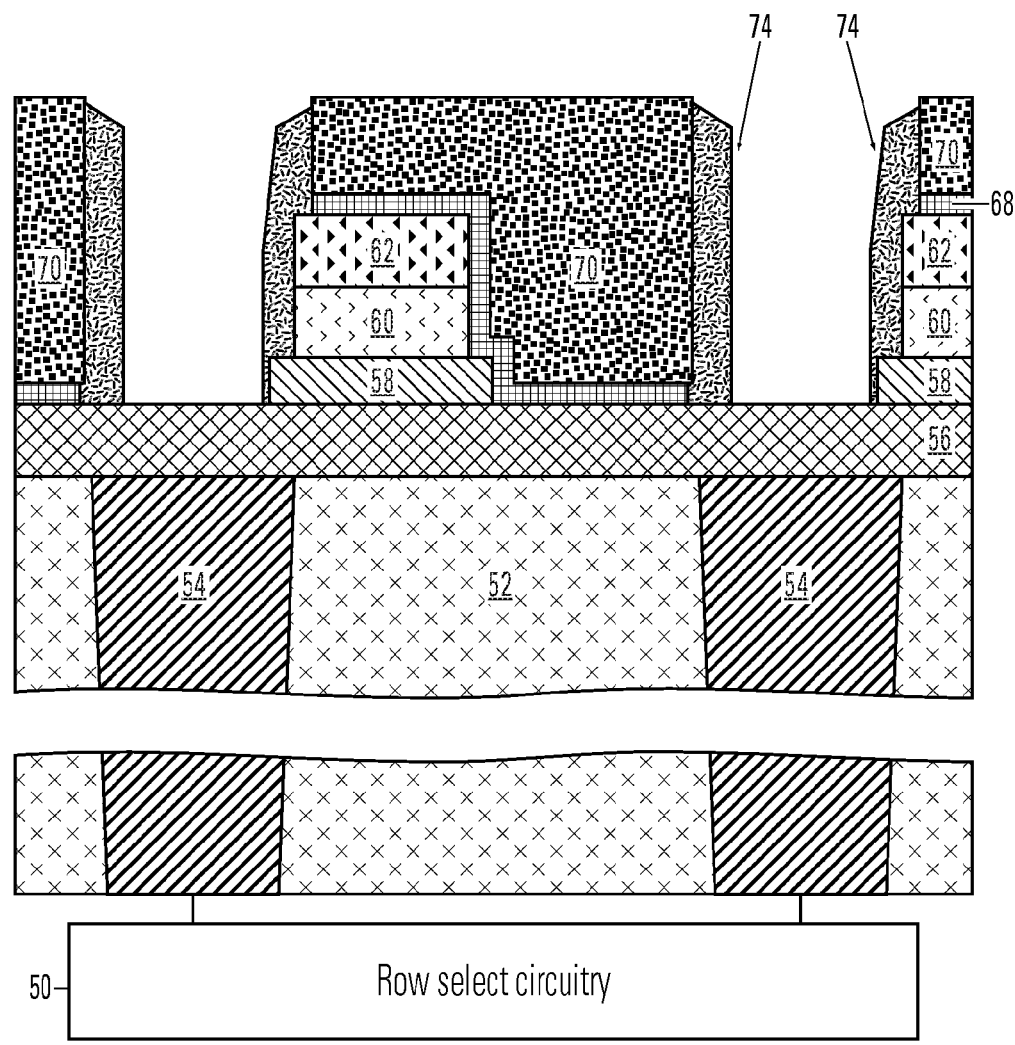
FIG. 5 is a cross-sectional view showing the sidewall structures in the vias, generated to electrically connect the programmable resistive memory with the conductive columns accessing the programmable resistive memory by column.

FIG. 5 is a cross-sectional view showing the sidewall structures in the vias, generated to electrically connect the programmable resistive memory with the conductive columns accessing the programmable resistive memory by column.

Etching of vias is performed, stopping on dielectric layer 68, using via-hole photoresist. Damage is prevented from the etching of dielectric layer 70, due to the high etching selectivity to dielectric layer 68, dielectric layer 56, conductive layer 58, conductive layer 60, and dielectric layer 62.

Specific examples of etching dielectric layer 70 depend on the material of dielectric layer 70, as follows:

For dielectric layer 70/dielectric layer 68 of SiO$_x$/SiN$_x$: etching examples include reactive-ion-etching with C$_4$F$_8$, C$_4$F$_6$, CHF$_3$, CF$_4$, Ar, O$_2$, and/or N$_2$ etc. to open dielectric layer 70 and stop on dielectric layer 68, using the high etching selectivity of SiO$_x$ to SiN$_x$.

The polymer residue is stripped using O$_2$, N$_2$, and/or N$_2$/H$_2$ plasma.

Dielectric layer 68 is wet etched using a suitable solvent. The wet dip of dielectric layer 68 opens the conductive layer 58 stairstep and conductive layer 60, but without opening dielectric layer 56.

Specific examples of wet etching dielectric layer 68 depend on the materials of dielectric layer 68, as follows:

For dielectric layer 68/dielectric layer 56 of SiN$_x$/SiO$_x$: wet etching examples include a tank process with hot phosphoric acid to open dielectric layer 68 and stop on dielectric layer 56, using the high etching selectivity of SiN$_x$ to SiO$_x$.

Dielectric layer 62 can have the same material or a different material from dielectric layer 68. If the materials are the same, the wet dip time is short to just open dielectric layer 68.

The conductive structure 74 is deposited on dielectric layer 56, with good conformality to conductive layer 58, conductive layer 60, and dielectric layer 70. The conductive structure 74 can be made by CVD, MOCVD, or electrodeposition etc.

Depending on the material of the resistive element, the material of the conductive structure 74 is TiN, Ti, TiN/Ti bilayer, TaN, W, Al, LiNbO$_3$, IrO$_x$, RuO$_x$, YBaCuO, LaCaMnO$_3$, Pt, metal-silicide, doped poly-Si, or etc. Specific examples of the conductive structure 74 depend on the material of the resistive element, as follows:

For phase change resistive elements of GST or N$_2$ doped GST etc.: examples of conductive structure 74 include TiN, TaN, W, or LiNbO$_3$ etc.

For resistance memory resistive elements of PrxCayMnO$_3$ etc.: examples of conductive structure 74 include LiNbO$_3$, YBaCuO, LaCaMnO$_3$, or Pt etc.

For polymer memory resistive elements of TCNQ, PCBM, Cu-TCNQ, or C$_{60}$-TCNQ etc.: examples of conductive structure 74 include Al or TiN etc.

The conductive structure 74 etch uses high bombardment reactive-ion plasma, such as Ar, CF4, and/or suitable chemistries, to form a straight conductive structure 74 around the via hole. The polymer residue is stripped using O2, N2, and/or N2/H2 plasma.

Figure 6:
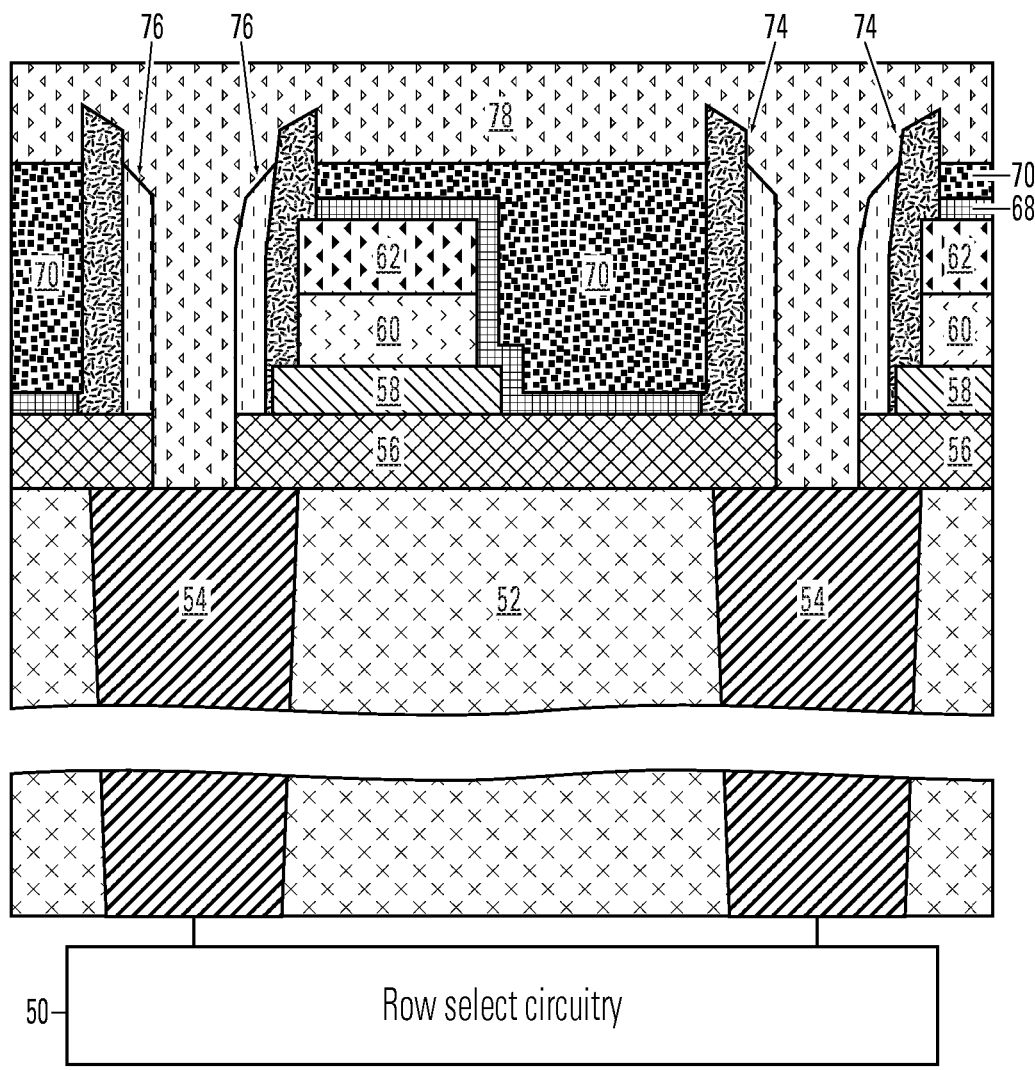
FIG. 6 is a cross-sectional view showing the conductive structures in the vias, generated to electrically connect the programmable resistive memory with the conductive rows accessing the programmable resistive memory by row.

FIG. 6 is a cross-sectional view showing the conductive structures in the vias, generated to electrically connect the programmable resistive memory with the conductive rows accessing the programmable resistive memory by row.

Dielectric structure 76 is deposited on dielectric layer 70, conductive structure 74 and dielectric layer 56 with good conformality.

Dielectric structure 76 can be SiO$_x$, SiO$_x$N$_y$, $_{SiNx}$, SrTiO$_3$, etc. The material of dielectric structure 76 has good adhesion to the resistive element.

Specific examples of dielectric structure 76 depend on the material of the resistive element, as follows:

For phase change resistive element such as GST or N$_2$ doped GST etc.: examples of the dielectric structure 76 include SiO$_x$, SiO$_x$N$_y$, and SiN$_x$ due to thermal conductivity concerns.

For resistance memory resistive element such as Prx-CayMnO$_3$ etc.: examples of dielectric structure 76 include SiO$_x$, SiO$_x$N$_y$, $_{SiNx}$, or SrTiO$_3$ due to adhesion concerns and grown crystal issues.

For polymer memory resistive elements such as TCNQ, PCBM, Cu-TCNQ, or $C_{60}$-TCNQ etc.: examples of dielectric structure 76 include $SiO_x$, $SiO_xN_y$, and $SiN_x$, or $AlO_x$ due to dielectric constant concerns.

Dielectric structure 76 is etched without a mask using high bombardment.

Specific examples of etching depend on the material of the dielectric structure 76 and dielectric layer 56, as follows Etching dielectric structure 76 method examples:

For dielectric structure 76/dielectric layer 56 of $SiO_x/SiO_x$ or $=SiO_xN_y/SiO_x$: examples of etching include reactive-ion-etching with $CF_4$, $CHF_3$, Ar, and/or $N_2$ etc. to open dielectric structure 76 and dielectric layer 56, stopping at contact 54 leading to the row select circuitry 50.

For dielectric structure 76/dielectric layer 56 of $AlO_x/SiO_x$: examples of etching include reactive-ion-etching with $CF_4$, $BCl_3$, $NF_3$, CO, $O_2$, and/or Ar, etc. to open dielectric structure 76 and transfer reactive-ion-etching with $CF_4$, $CHF_3$, Ar, and/or $N_2$ etc. to open dielectric layer 56, stopping at contact 54 leading to the row select circuitry 50.

Due to chemistry properties, the etching rate of conductive structure 74 is low during etching dielectric structure 76 and dielectric layer 56. So conductive structure 74 is exposed.

Dielectric structure 76 prevents conductive structure 74 from current leakage to row select circuitry 50. The thickness of the dielectric structure 76 ranges from 5 nm 100 nm. (i.e., width of dielectric structure 76 Spacer ranges 5 nm~100 nm.)

The polymer residue is stripped using O2, N2, and/or N2/H2 plasma.

Conductive electrode 78 fills in the hole defined by dielectric structure 76. The conductive electrode 78 connects to the contact 54 of the row select circuitry 50. Conductive electrode 78 is deposited on dielectric layer 70, conductive structure 74, dielectric structure 76, dielectric layer 56, and contact 54 of row select circuitry 50. Conductive electrode 78 can be CVD W, or CVD TiN, PVD TaN/electrodeposited Cu, etc. with enough thickness to cover the whole surface.

Figure 7:
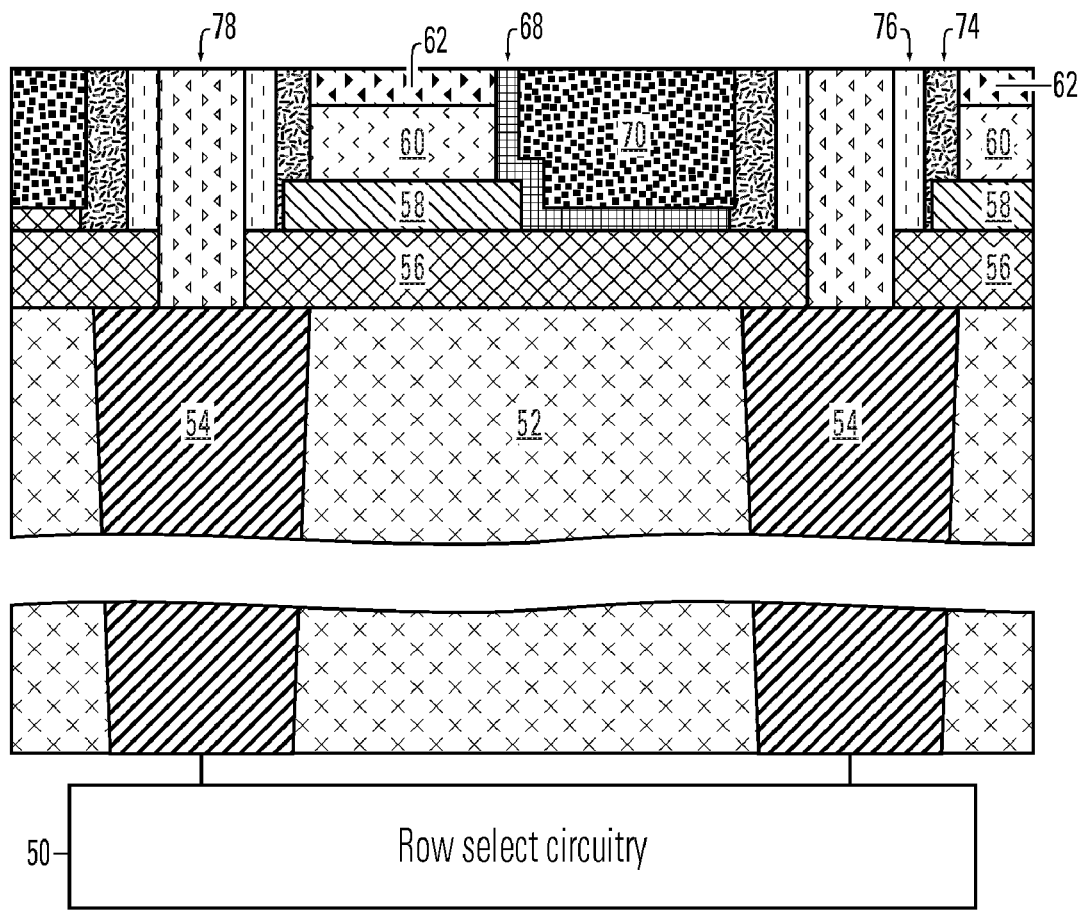
FIG. 7 is a cross-sectional view after the removal of excess material by chemical mechanical polishing.

FIG. 7 is a cross-sectional view after the removal of excess material by chemical mechanical polishing.

CMP of conductive electrode 78 plays an important role of yield. Conductive electrode 78 is polished until conductive structure 74 is exposed, and further polished until touching dielectric layer 70.

Dielectric layer 70 is polished until dielectric layer 68 is exposed, and further polished until exposing dielectric layer 62.

The CMP slurry has no significant selective polishing rate to dielectric layer 70, dielectric layer 68, dielectric structure 76, conductive electrode 78, and conductive structure 74. An example of slurry is SiO2.

In some embodiments, after polishing, the width of dielectric structure 76 and conductive structure 74 is uniform for similarly uniform electric performance.

A scrubber cleaning after polishing ensures an open circuit between conductive electrode 78 and conductive structure 74.

Figure 8:
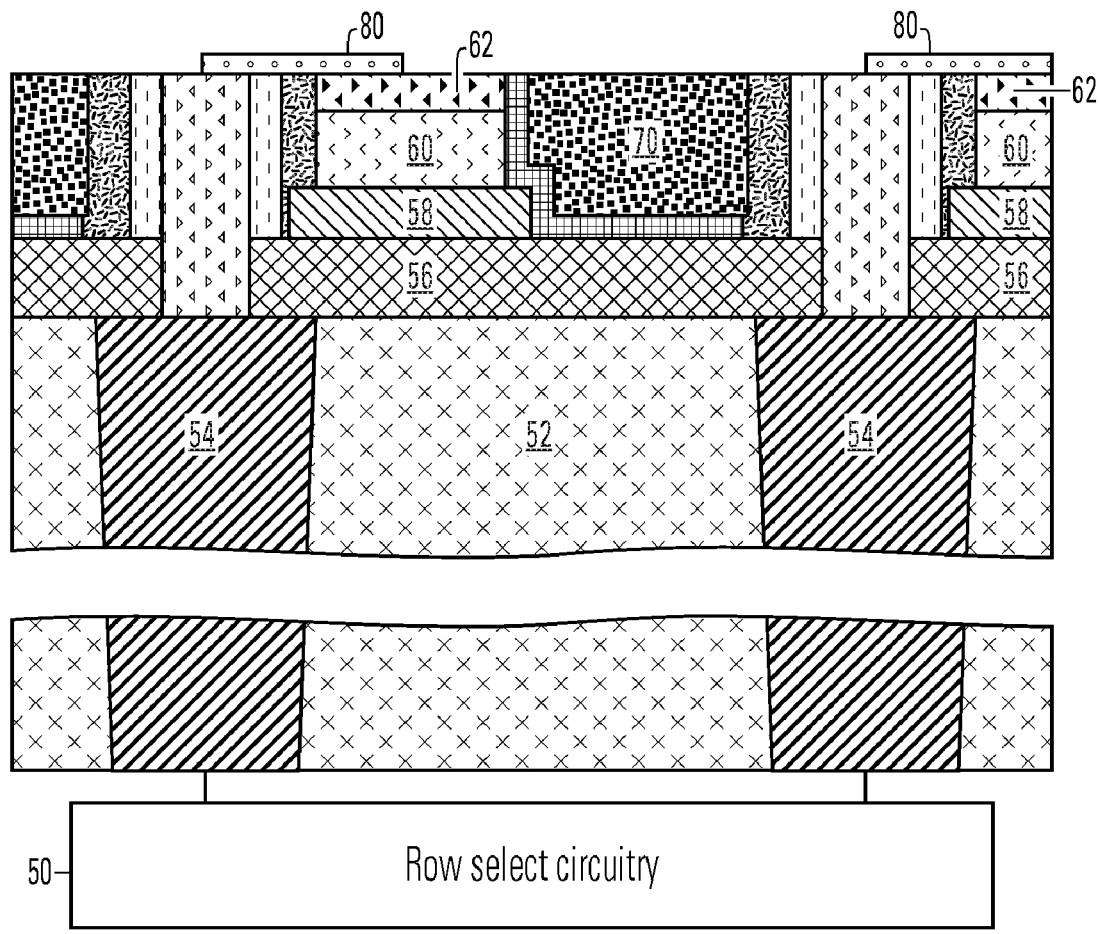
FIG. 8 is a cross-sectional view showing the programmable resistive elements storing nonvolatile data for each nonvolatile memory cell.

FIG. 8 is a cross-sectional view showing the programmable resistive elements 80 storing nonvolatile data for each nonvolatile memory cell.

Specific examples of resistive element deposition depend on the type of programmable resistive nonvolatile memory device, as follows:

For phase change resistive devices: example materials of resistive elements include $Ge_xSb_yTe_z$ (GST), $N_2$-doped GST, $Ge_xSb_y$, or any kind of material that uses different crystallized phase changes to determine resistance.

For resistance memory resistive devices: example materials of resistive elements include $PrCaMnO_3$, $PrSrMnO_3$, $ZrO_x$, or any kind of materials that can use voltage pulse (differently polarized) to change and retain the resistance state.

For polymer memory resistive device: example materials of resistive elements include Cu-TCNQ, Ag-TCNQ, $C_{60}$-TCNQ, or any kind of metal doped-TCNQ, PCBM, TCNQ-PCBM, or any kind of polymer material that has bistable or multi-stable resistance states controlled by a voltage pulse or by a current density.

More broadly, the resistive element can include any kind of material that is 2-terminal controlled and has bistable or multi-stable resistance states, controlled by voltage, current density, current polarization, or any kind of electrical characterization.

The resistive element 80 has a thickness, which depends on the material properties, and is deposited on conductive electrode 78 and conductive structure 74 to conductively connect to both. The distance between conductive electrode 78 and conductive structure 74 is tunable and depends on the width of the dielectric structure 76.

In some embodiments, the resistive element has a cap layer to prevent changes in characteristics due to air exposure.

In some embodiments, the resistive element pattern is defined by a rectangle-shaped photolithography. The length dimension is orthogonal to the direction of the conductive columns formed by conductive layer 60 and conductive layer 58. The length of the resistive element runs from within an area defined by conductive electrode 78, over dielectric structure 76, conductive structure 74, and ending within an area defined by dielectric layer 62.

Before etching the resistive elements, a trimming or shrinkage process such as cap layer wet dip can be used.

Specific examples of etching chemistry of resistive element etching depend on the material of the resistive element, as follows:

For phase change resistive devices such as GST, or $N_2$-doped GST, etc.: etching chemistry examples include $CF_4$, $Cl_2$, Ar, $O_2$, $CHF_3$, $BCl_3$, and/or $N_2$ etc.

For resistance memory resistive devices such as $PrCaMnO_3$, etc.: etching chemistry examples include Ar, $CF_4$, and/or $O_2$ etc. to etch with high bombardment.

For resistance memory resistive devices such as Cu-TCNQ, etc.: etching chemistry examples include $O_2$, Ar, and/or $CF_4$ to etch with cap layer hard-mask.

Figure 9:
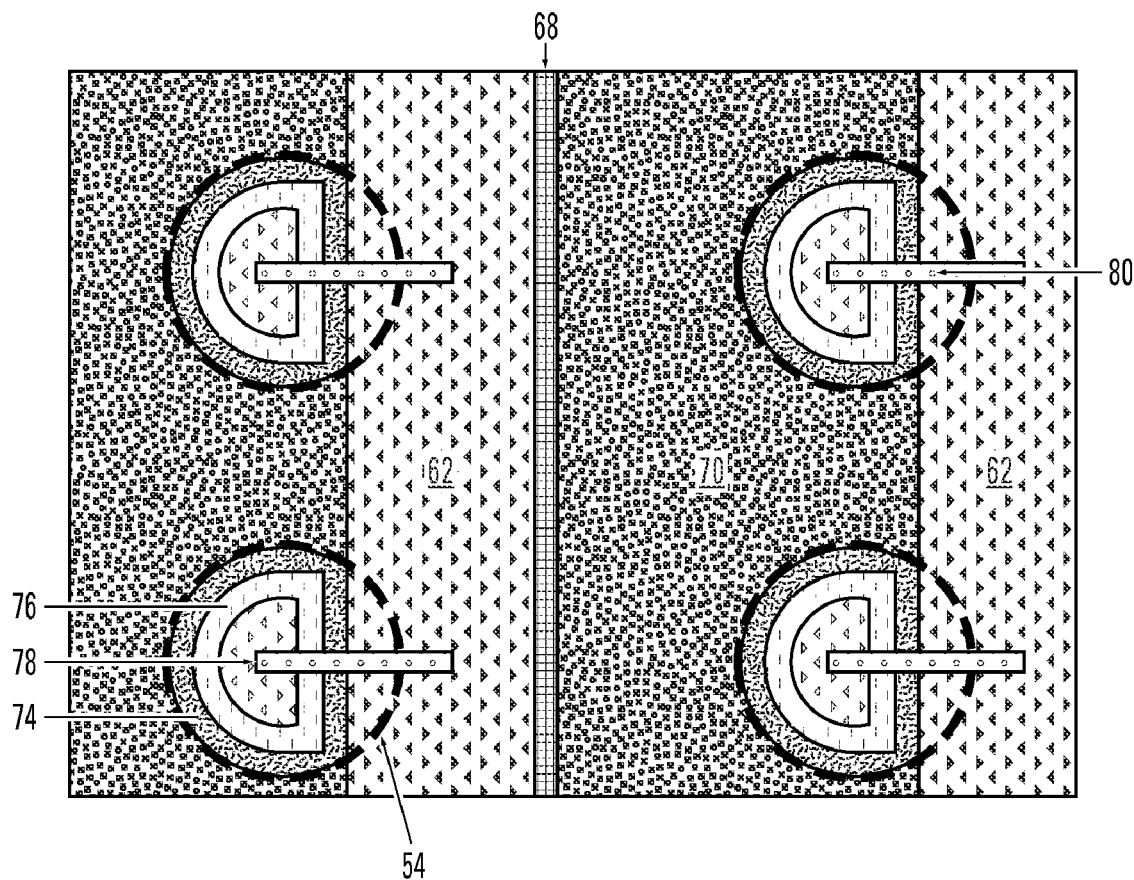
FIG. 9 is a top view of an array of programmable resistive nonvolatile memory cells.

FIG. 9 is a top view of an array of programmable resistive nonvolatile memory cells.

Although each contact 54 are positioned beneath a corresponding conductive structure 74, dielectric structure 76, and conductive electrode 78, the lateral positions of the contacts 54 are indicated by hyphenated outlines. Shown is an exposed part of dielectric layer 68, shaped as a stripe parallel to the conductive columns 58 and 60 and the dielectric layer 62. Also shown is an exposed part of dielectric layer 62 adjacent to the exposed part of dielectric layer 68, and an exposed part of dielectric layer 70 adjacent to an exposed part of dielectric layer 68 and an exposed part of dielectric layer 62. As with FIG. 8, resistive element 80 is shown in conductive connection with conductive electrode 78 and conductive structure 74.

Embodiments of the memory cell include phase change based memory materials, including chalcogenide based materials and other materials, for the resistive element 80. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to be as GST, and it will be understood that other types of phase change materials can be used. A material useful for implementation of a PCRAM described herein is $Ge_2Sb_2Te_5$.

Other programmable resistive memory materials may be used in other embodiments of the invention, including N2 doped GST, $Ge_xSb_y$, or other material that uses different crystal phase changes to determine resistance; $Pr_xCa_yMnO_3$, $PrSrMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, N2, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an N2 ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as Ni$_x$O$_y$; Ti$_x$O$_y$; Al$_x$O$_y$; W$_x$O$_y$; Zn$_x$O$_y$; Zr$_x$O$_y$; Cu$_x$O$_y$; etc, where x:y=0.5:0.5, or other compositions with x: 0~1; y: 0~1. An exemplary formation method uses a PVD sputtering or magnetron-sputtering method with reactive gases of Ar, N$_2$, O$_2$, and/or He, etc. at the pressure of 1 mTorr~100 mTorr, using a target of metal oxide, such as Ni$_x$O$_y$; Ti$_x$O$_y$; Al$_x$O$_y$; W$_x$O$_y$; Zn$_x$O$_y$; Zr$_x$O$_y$; Cu$_x$O$_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an N$_2$ ambient or O$_2$/N$_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of Ar/O$_2$, Ar/N$_2$/O$_2$, pure O$_2$, He/O$_2$, He/N$_2$/O$_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an N2 ambient or O$_2$/N$_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure O$_2$ or N$_2$/O$_2$ mixed gas at a pressure of several mTorr to 1 atm. The time can range several minute to hours. Another oxidation method is plasma oxidation. An RF or a DC source plasma with pure O$_2$ or Ar/O$_2$ mixed gas or Ar/N$_2$/O$_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, C$_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an N$_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Figure 10:
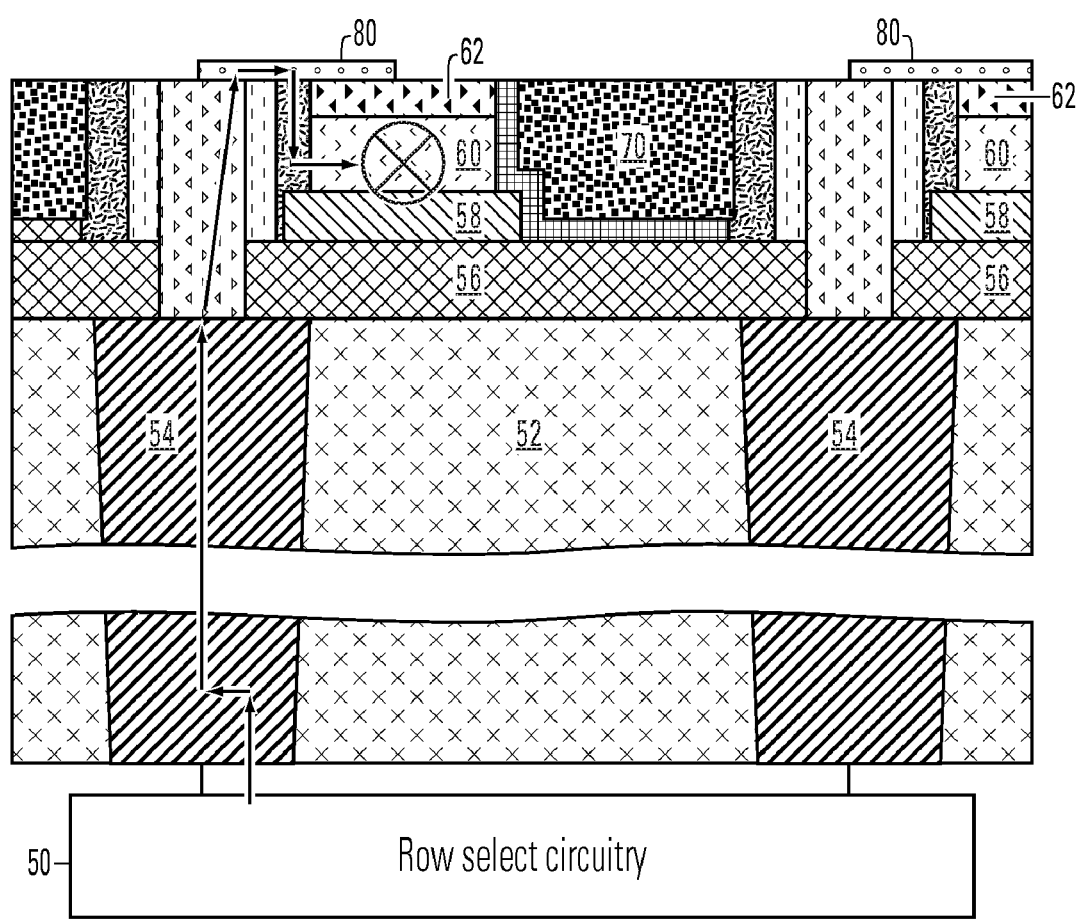
FIG. 10 is a cross-sectional view showing the path of current, through the conductive rows accessing the programmable resistive memory by row, the programmable resistive element, and the conductive columns accessing the programmable resistive memory by column.

FIG. 10 is a cross-sectional view showing the path of current, through the conductive rows accessing the programmable resistive memory by row, the programmable resistive element, and the conductive columns accessing the programmable resistive memory by column.

Current is shown flowing from row select circuitry 50, through a contact 54, a conductive electrode 78, the resistive element 80, the conductive structure 74, and the conductive column 60. The magnitude of this current is controlled by the state of the resistive element 80. The particular resistive element is selected by row select circuitry 50 and column select circuitry (not shown) connected to the conductive column 60.

Example embodiments for phased change memory are formed as follows:

The composition and thickness of dielectric layer 56 is 10~50 nm thick SiO$_2$. The composition and thickness of conductive layer 58 is ~20 nm thick TiN. The composition and thickness of conductive layer 60 is ~250 nm thick AlCu. The composition and thickness of dielectric layer 62 is 30~200 nm thick SiON. A conventional PVD-CVD embedded tool can perform the deposition. The conductive layer etch and strip can be performed by conventional TCP reactive-ion-etcher tool.

The composition and thickness of dielectric layer 68 is ~20 nm thick SiN. The composition and thickness of dielectric layer 70 is 350~600 nm thick SiO$_2$. Deposition can be performed by conventional IMD processing, with PECVD SiN and HDP-CVD+PECVD SiO$_2$+oxide CMP. The via etching and strip can be performed by conventional high-plasma-density MERIE tool.

The composition and thickness of conductive structure 74 is 5~400 nm thick TiN. Conventional TiN CVD or ion-metal PVD deposition can perform deposition. The conductive structure 74 etching and strip can be performed by conventional TCP reactive-ion-etcher tool.

The composition and thickness of dielectric structure 76 is 5~100 nm thick SiO$_2$. Deposition can be performed by conventional PE-oxide. Dielectric structure 76 etch back can be performed by conventional high-plasma-density MERIE tool.

The composition and thickness of conductive electrode 78 is 400~650 nm thick W. Deposition can be performed by conventional W-CVD. Conventional W-CMP is used to cover the planarization work.

The composition and thickness of resistive element 80 is 5~50 nm thick N2-doped GST. Deposition can be performed by conventional PVD sputter and treatment by a suitable temperature of, such as 250 C. Resistive element 80 etching and strip can be performed by conventional TCP reactive-ion-etcher tool.

Figure 11:
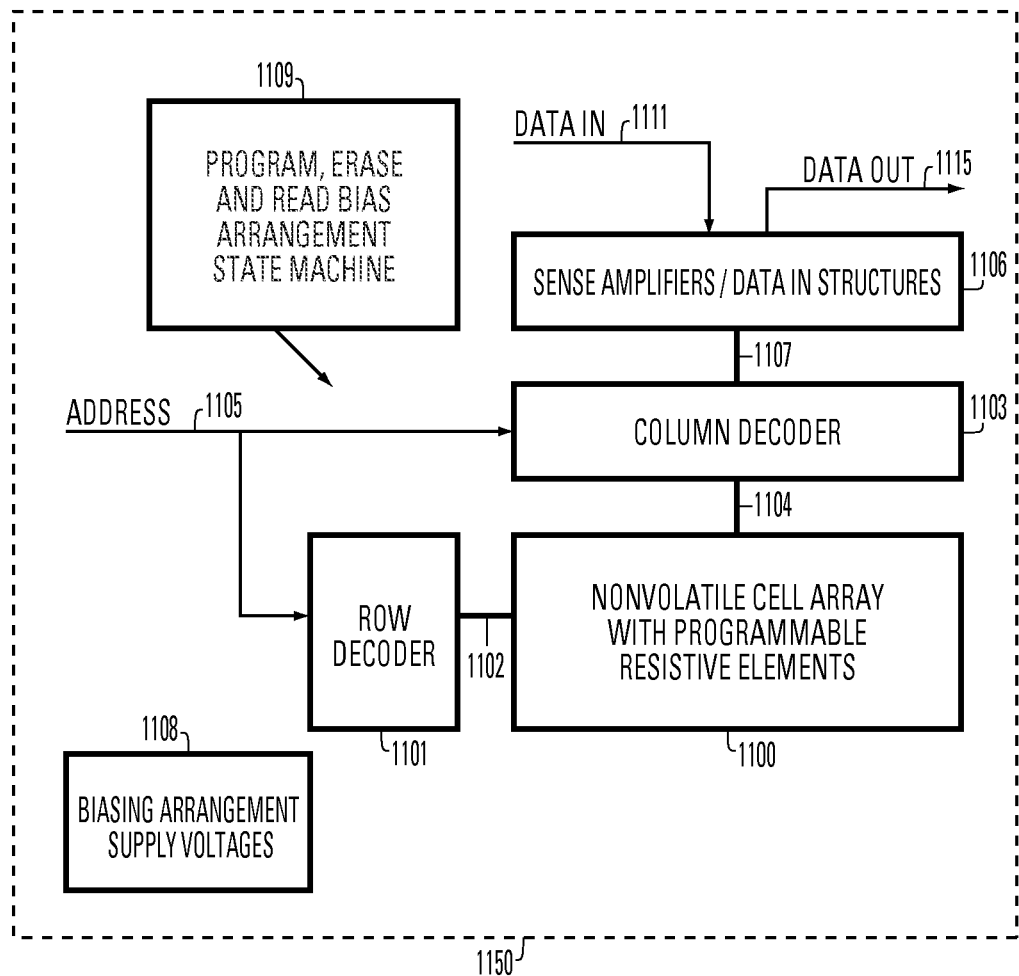
FIG. 11 is a block diagram of the integrated circuit including an array of nonvolatile programmable resistive memory cells, and other circuitry.

FIG. 11 is a block diagram of the integrated circuit including an array of nonvolatile programmable resistive memory cells, and other circuitry.

The integrated circuit 1150 includes a memory array 1100 implemented using memory cells with resistive elements on a semiconductor substrate. Addresses are supplied on bus 1105 to column decoder 1103 and row decoder 1101. Sense amplifiers and data-in structures in block 1106 are coupled to the column decoder 1103 via data bus 1107. Data is supplied via the data-in line 1111 from input/output ports on the integrated circuit 1150, or from other data sources internal or external to the integrated circuit 1150, to the data-in structures in block 1106. Data is supplied via the data-out line 1115 from the block 1106 to input/output ports on the integrated circuit 1150, or to other data destinations internal or external to the integrated circuit 1150. The integrated circuit 1150 may also include circuitry directed a mission function other than the nonvolatile storage with resistive elements (not shown).

A controller implemented in this example using bias arrangement state machine 1109 controls the application of bias arrangement supply voltages 1108, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

As used herein, layers are planar in the sense there is some vertical order among layers, but layers are in some cases flat and in other cases characterized by many features with valleys and peaks that result in the layers deviating substantially from flatness.

Terms describe positions of layers with respect to each other are relative unless otherwise specified. For example, a layer "covers" another layer or is "above" another layer, even in the presence of an intervening layer (e.g., between the covering layer and the covered layer, or between the "above" layer and the "below" layer. A layer is "between" two other layers, regardless of any intervening layers on either side.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming an integrated circuit with nonvolatile memory cells, comprising:
    forming circuitry accessing particular nonvolatile memory cells, including:
        forming conductive rows accessing the nonvolatile memory cells by row; and
        forming conductive columns accessing the nonvolatile memory cells by column, including:
            forming a first layer of conductive columns; and
            forming a second layer of conductive columns at least partly covering the first layer of conductive columns,
            wherein the first layer of conductive columns and the second layer of conductive columns have at least one of an etching endpoint signal difference and an etching selectivity difference; and then
    forming programmable resistive elements of the nonvolatile memory cells to conductively connect each of the programmable resistive elements with the conductive rows and the conductive columns.

2. The method of claim 1, further comprising:
    forming all transistors of the conductive rows of the integrated circuit before forming the programmable resistive elements.

3. The method of claim 1, wherein the conductive rows are substantially orthogonal to the conductive columns.

4. The method of claim 1,
    wherein said forming the conductive columns results in a stairstep profile of said first layer of conductive columns and said second layer of conductive columns.

5. The method of claim 4, wherein the stairstep profile results from:
    removing material excess to the second layer of conductive columns;
    forming sidewalls at least partly covering the second layer of conductive columns; and
    removing the sidewalls and conductive material excess to the first layer of conductive columns.

6. The method of claim 5, wherein the sidewalls are up to 200 nm thick.

7. The method of claim 1, wherein said forming circuitry includes:
    forming a dielectric layer at least partly between the programmable resistive elements and the conductive columns.

8. The method of claim 1, wherein said forming circuitry includes:
    forming interlayer dielectric, after said forming conductive rows and before said forming conductive columns; and then
    forming at least one dielectric layer before said forming conductive columns,
    wherein said forming conductive columns accessing the nonvolatile memory cells by column includes:
        removing material excess to the first layer of conductive columns until reaching said at least one dielectric layer.

9. The method of claim 1, wherein said forming circuitry includes:
    forming at least a first dielectric layer, after said forming conductive rows and before said forming conductive columns; and
    forming at least a second dielectric layer, said second dielectric layer at least partly covers the conductive columns and is at least partly adjacent to the first dielectric layer; and
    forming at least a third dielectric layer substantially covering the second dielectric layer,
    wherein the second dielectric layer and the third dielectric layer have at least one of an etching endpoint signal difference and an etching selectivity difference.

10. The method of claim 1, wherein said forming circuitry includes:
    forming at least a first dielectric layer, after said forming conductive rows and before said forming conductive columns; and
    forming at least a second dielectric layer, said second dielectric layer at least partly covers the conductive columns and is at least partly adjacent to the first dielectric layer,
    wherein the first dielectric layer and the second dielectric layer have at least one of an etching endpoint signal difference and an etching selectivity difference.

11. The method of claim 1, wherein said forming circuitry includes:
forming at least a first dielectric layer, after said forming conductive rows and before said forming conductive columns; and
forming at least a second dielectric layer, said second dielectric layer at least partly covers the conductive columns and is at least partly adjacent to the first dielectric layer; and
forming at least a third dielectric layer at least partly covering the second dielectric layer; and
forming holes through the second dielectric layer and the third dielectric layer until reaching the first dielectric layer, to at least partly expose the conductive columns, and to form interlayer contacts between the conductive rows and the programmable resistive elements.

12. The method of claim 11, wherein the second dielectric layer has a thickness of about 10 nm to 50 nm.

13. The method of claim 1, wherein said forming circuitry further includes:
forming holes through dielectric material adjacent to the conductive columns, to at least partly expose the conductive columns, and to form interlayer contacts between the conductive rows and the programmable resistive elements; and
forming conductive lining in the holes to conductively connect the conductive columns and the programmable resistive elements.

14. The method of claim 1, wherein said forming circuitry further includes:
forming holes with conductive lining adjacent to the conductive columns, to form interlayer contacts between the conductive rows and the programmable resistive elements, and to conductively connect the conductive columns and the programmable resistive elements; and
forming dielectric lining in the holes to allow conductive connection between the conductive rows and the conductive lining only via the programmable resistive elements.

15. The method of claim 14, wherein the dielectric lining has a thickness between 5 nm and 100 nm.

16. The method of claim 1, wherein said forming circuitry further includes:
forming holes through dielectric material adjacent to the conductive columns, to conductively connect the conductive rows and the programmable resistive elements, and to conductively connect the conductive columns and the programmable resistive elements; and
forming conductive structures in the holes to conductively connect the conductive rows and the programmable resistive elements.

17. The method of claim 1, wherein said forming circuitry includes:
forming at least a first dielectric layer, after said forming conductive rows and before said forming conductive columns;
forming at least a second dielectric layer, said second dielectric layer at least partly covers the conductive columns and is at least partly adjacent to the first dielectric layer;
forming at least a third dielectric layer at least partly covering the second dielectric layer;
forming interlayer contacts, including:
forming holes through dielectric material adjacent to the conductive columns;
forming conductive lining in the holes to conductively connect the conductive columns and the programmable resistive elements;
forming dielectric lining in the holes to allow conductive connection between the conductive rows and the conductive lining only via the programmable resistive elements; and
forming conductive structures in the holes to conductively connect the conductive rows and the programmable resistive elements; and
performing chemical mechanical polishing non-selectively among the second dielectric layer, the third dielectric layer, the conductive lining, the dielectric lining, and the conductive structures.

18. The method of claim 1, wherein said forming circuitry includes:
forming at least a first dielectric layer, after said forming conductive rows and before said forming conductive columns;
forming at least a second dielectric layer, said second dielectric layer at least partly covers the conductive columns and is at least partly adjacent to the first dielectric layer;
forming at least a third dielectric layer at least partly covering the second dielectric layer;
forming interlayer contacts, including:
forming holes through dielectric material adjacent to the conductive columns;
forming conductive lining in the holes to conductively connect the conductive columns and the programmable resistive elements;
forming dielectric lining in the holes to allow conductive connection between the conductive rows and the conductive lining only via the programmable resistive elements; and
forming conductive structures in the holes to conductively connect the conductive rows and the programmable resistive elements; and
performing chemical mechanical polishing to remove the conductive lining until an elevation of the conductive lining is no higher than an elevation of parts of the third dielectric layer by the conductive lining.

19. The method of claim 1, wherein said forming circuitry includes:
forming at least a first dielectric layer, after said forming conductive rows and before said forming conductive columns;
forming at least a second dielectric layer, said second dielectric layer at least partly covers the conductive columns and is at least partly adjacent to the first dielectric layer;
forming at least a third dielectric layer substantially covering the second dielectric layer;
forming interlayer contacts, including:
forming holes through dielectric material adjacent to the conductive columns;
forming conductive lining in the holes to conductively connect the conductive columns and the programmable resistive elements;
forming dielectric lining in the holes to allow conductive connection between the conductive rows and the conductive lining only via the programmable resistive elements; and
forming conductive structures in the holes to conductively connect the conductive rows and the programmable resistive elements; and performing chemical mechanical polishing on parts of the second dielectric and the third dielectric until said parts no longer cover the conductive columns.

20. The method of claim 1, wherein said forming programmable resistive elements is a last step of fabrication.

21. A method of forming a memory cell, comprising:
forming a conductive column, including:
forming a first layer of the conductive column; and
forming a second layer of the conductive column at least partly covering the first layer of the conductive column,
wherein the first layer of the conductive column and the second layer of the conductive column have at least one of an etching endpoint signal difference and an etching selectivity difference; and
forming a dielectric structure to define a hole;
forming a first electrode in the hole;
forming a second electrode beside the dielectric structure, the second electrode electrically coupled to the conductive column;
forming a memory element over the first electrode, the second electrode and the conductive column, wherein the memory element is electrically coupled to the first and second electrodes.

22. The method of claim 21, wherein the second electrode is a conductive row.

* * * * *